United States Patent [19]

Grimes

[11] Patent Number: 4,631,428
[45] Date of Patent: Dec. 23, 1986

[54] COMMUNICATION INTERFACE CONNECTING BINARY LOGIC UNIT THROUGH A TRINARY LOGIC TRANSMISSION CHANNEL

[75] Inventor: Dwight W. Grimes, Boca Raton, Fla.

[73] Assignee: International Business Machines Corporation, Armonk, N.Y.

[21] Appl. No.: 665,312

[22] Filed: Oct. 26, 1984

[51] Int. Cl.⁴ .......................................... H03K 19/094
[52] U.S. Cl. .................................... 307/475; 307/264; 307/361; 307/463; 307/473; 375/17
[58] Field of Search ............... 307/463, 473, 475, 264, 307/360–364, 243–244, 449, 451; 375/17, 36–37

[56] References Cited

U.S. PATENT DOCUMENTS

| | | | |
|---|---|---|---|
| Re. 30,182 | 12/1979 | Howson | 325/42 |
| 3,126,537 | 3/1964 | Trampel | 340/347 |
| 3,217,316 | 11/1965 | Trampel | 340/347 |
| 3,798,544 | 3/1974 | Norman | 375/17 X |
| 3,832,576 | 8/1974 | Proebsting | 307/473 |
| 3,866,147 | 2/1975 | De Couvreur et al. | 307/473 X |
| 4,282,601 | 8/1981 | Flora | 375/17 X |
| 4,302,690 | 11/1981 | Gollinger et al. | 307/452 |
| 4,327,424 | 4/1982 | Wu | 365/104 |
| 4,380,080 | 4/1983 | Rattlingourd | 375/17 |

FOREIGN PATENT DOCUMENTS 0168723 9/1984 Japan ...................... 307/473

Primary Examiner—Stanley D. Miller
Assistant Examiner—D. R. Hudspeth
Attorney, Agent, or Firm—James A. Kunkle; D. K. Cooper; J. Jancin, Jr.

[57] ABSTRACT

A communications interface for transferring data from a first binary logic circuit to a second binary logic circuit by using a trinary logic transmission channel. The first set of binary logic signals is converted into a first set of binary control signals which, in turn, control trinary drivers connected to the transmission channel. The trinary drivers drive the transmission channel to one of three discrete voltage levels as opposed to one of two levels in binary systems. Trinary receivers are located on the second binary logic circuit and are connected to the trinary transmission channel. The receivers produce a second set of binary control signals which are translated into a second set of binary logic signals for use by the second binary logic circuit.

24 Claims, 15 Drawing Figures

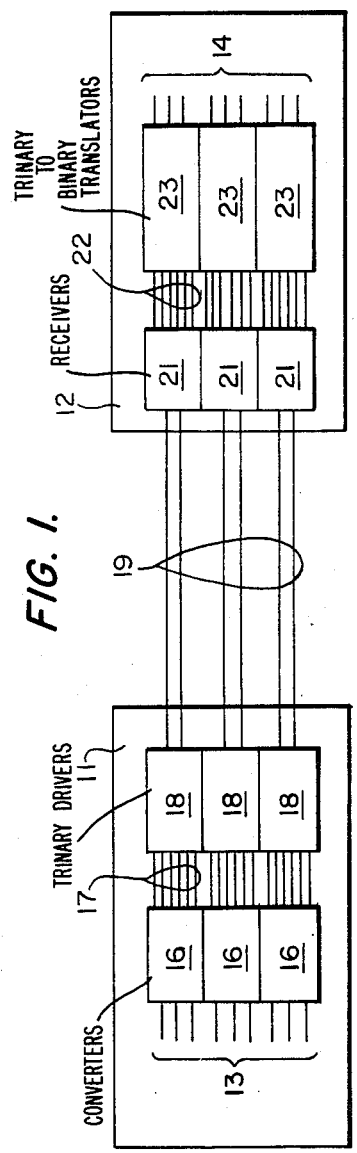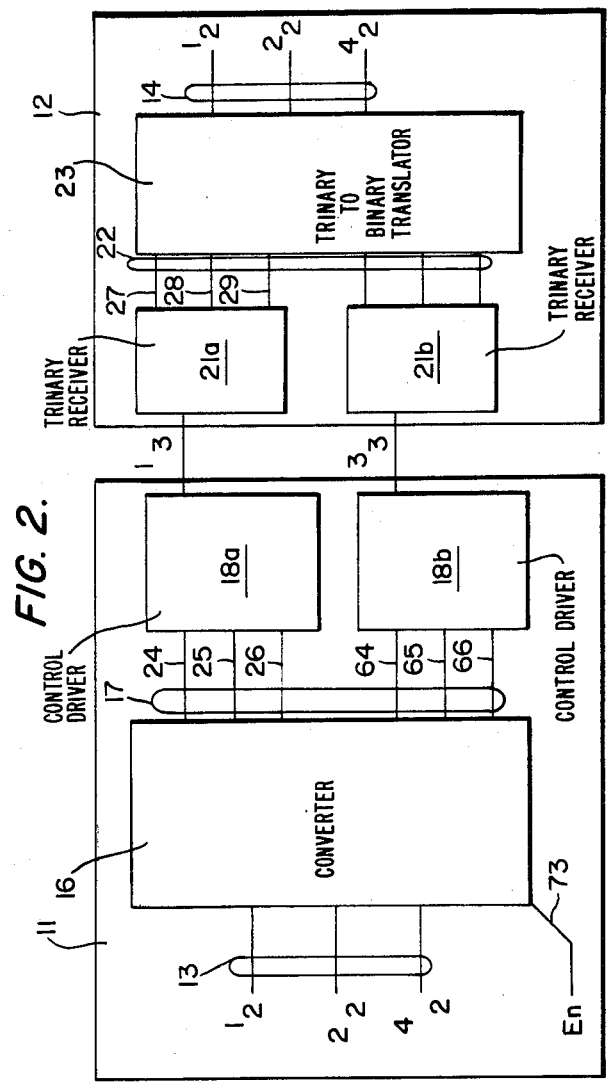

COMMUNICATION INTERFACE CONNECTING BINARY LOGIC UNIT THROUGH A TRINARY LOGIC TRANSMISSION CHANNEL

DESCRIPTION

1. Field of Invention

This invention relates to trinary logic parallel communications interface circuits used to interface binary logic circuits.

2. Background

Binary logic circuits are often integrated using LSI and VLSI circuit technology. Advances in integrated circuit technology facilitate an ever increasing circuit density. As the density of the integrated circuit increases, more and more data is able to be processed by any given integrated chip. In addition, in a never-ending quest for processing speed, parallel processing is used with the bit length of a data word for any given machine also ever increasing. For example, where early binary logic circuits used words with a bit length of 4 or 8 bits, today's machines utilize words as high as 128 bits in length, and this length will most certainly increase in the future.

As a result of this increasing circuit density and word bit length, the limiting factor in the number of circuits that can be placed on a single integrated chip is often not the limited chip area; but instead, the limiting factor is the number of input/output pads on the chip surface, or input/output pins on the chip carrier.

SUMMARY OF THE INVENTION

The present invention solves the aforementioned limitation problem by reducing the number of input/output interconnections to two-thirds that of a conventional parallel binary interface.

This dramatic reduction is realized by an apparatus which includes a binary to trinary converter which converts binary signals located on a first binary logic circuit into binary control signals. These control signals control trinary drivers that drive a set of interconnection lines leading from the first binary logic circuit chip to a second binary logic circuit chip, each interconnection line being driven to one of three discrete voltage levels. The number of lines in the set of interconnecting lines is approximately equal to two-thirds the number of interconnecting lines necessary to transmit binary logic signals. This is due to the fact that each trinary digit (trit) has three voltage levels whereas a bit has only two voltage levels. The second binary logic circuit chip contains receivers for receiving the trinary signals transmitted over the set of lines. The second binary logic circuit chip also contains a trinary to binary converter for converting the received signals from trinary back into binary for use by the second logic circuit chip.

This dramatic reduction in the number of interconnecting lines is realized by the addition of an insignificant number of circuits as compared to the number of circuits on an LSI or a VLSI chip. In addition, several different circuits are disclosed, including bipolar and MOSFET logic, which allows the invention to be readily adapted to binary logic circuits regardless of the integrated technology used.

It is therefore a primary object of the invention to provide an interface system for interfacing binary logic circuits using trinary logic lines for reducing the number of interconnections therebetween.

It is another object of the invention to provide an interface circuit for binary logic circuits constructed of components compatible with the technology used to construct the existing binary logic circuits.

The foregoing and other objects, features, extentions, and advantages of the invention will be apparent from the following more detailed description of the preferred embodiments with reference to the accompanying drawing.

BRIEF DESCRIPTION OF THE DRAWING

FIG. 1 is a trinary interface according to the invention using six trits to interface two binary logic circuits each using nine bits.

FIG. 2 is the basic building block of the trinary interface of FIG. 1.

DETAILED DESCRIPTION

Figure 3:
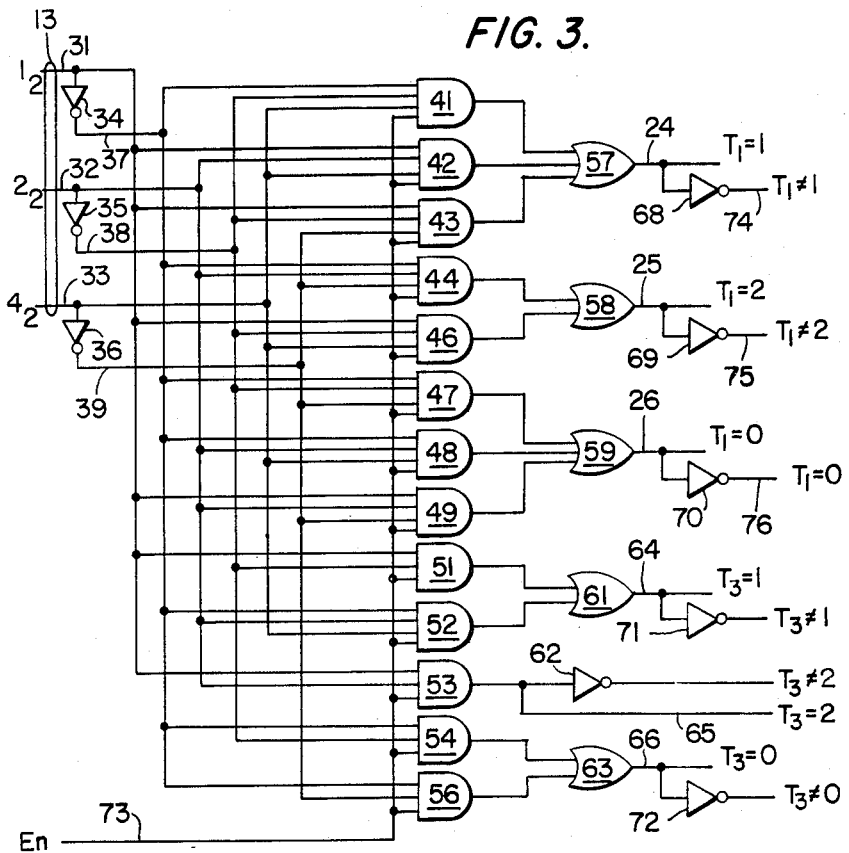
FIG. 3 is a logic diagram of a hardware implementation of the binary to trinary converter of FIGS. 1 and 2.

Referring to FIG. 1, binary logic circuits 11 and 12 consist of known binary logic elements which generate and manipulate binary logic bits. During the operation of circuits 11 and 12, it may be necessary to transfer information in the form of parallel binary logic bits back and forth between binary circuit 11 and binary circuit 12. For example, a 9-bit word (e.g., an 8-bit word with one parity bit) generated by circuitry (not shown) on binary circuit 11 and appearing on lines 13 may be required to be transferred to lines 14 located on binary circuit 12. In conventional parallel communication, each line 13 would be connected to an input/output pin of binary logic circuit 11, which in turn would be connected to pins of binary logic circuit 12 by intermediate electrical conductors. The pins on logic circuit 12 would be connected to lines 14 thereby completing an electrical circuit consisting of nine parallel conductors between lines 13 on binary circuit 11 and lines 14 on binary circuit 12.

In direct contrast, the present invention accomplishes the transfer of an equivalent amount of logic information, while using two-thirds as many intermediate conductors and input/output pins. In the present invention, the binary bits on lines 13 are divided into groups of three bits in adjacent bit positions with each group of three connected to a binary to trinary converter 16. Each converter 16 converts the three binary input bits into binary control signals appearing on lines 17. Lines 17 control trinary drivers 18 each of which drive two transmission lines 19, each line 19 transferring one trit of information. As described below, each line 19 is driven to one of three discrete voltage levels as compared to one of two discrete voltage levels appearing on lines 13. Lines 19 enter binary logic circuit 12 and terminate at trinary receivers 21. Receivers 21 convert the trinary information on lines 19 into binary control signals appearing on binary control lines 22. Trinary to binary translators 23 accept the information on control lines 22 and translate the trinary information contained on control lines 22 into binary bits on lines 14.

With respect to FIG. 1, nine bits of information appearing on lines 13 and 14 have been concentrated to six trits of information appearing on lines 19 resulting in a one-third reduction of interconnecting transmission lines and input/output pins. Here it should be emphasized that any number of binary bits may be transferred using the present invention by simply adding additional converter/transmitter/translator blocks to FIG. 1. One such block is shown in FIG. 2. The basic building block for the present invention is shown in FIG. 2 and represents the elements required to transfer three binary logic bits, in parallel, across two trinary logic transmission lines. As can be seen, FIG. 1 comprises three of the basic building blocks shown in FIG. 2. As mentioned above, any number of the basic building blocks shown in FIG. 2 can be assembled to transmit an arbitrary number of binary logic bits appearing on a first set of lines across approximately two-thirds as many trinary logic lines.

Referring to FIG. 2, lines 13 comprise three binary lines which carry, for example, binary signals representative of one base two ($1_2$), two base two ($2_2$), and four base two ($4_2$). It should be emphasized that the designation of these particular bit positions is for illustrative purposes only and it will be understood, by those skilled in the art, that any three bits selected from adjacent bit positions can be used. Converter 16 converts the binary signals on lines 13 into binary control signals appearing on lines 17. Lines 17 are divided into two groups of three lines each, each group controlling the state of a corresponding trit. For example, the top group of three lines (lines 24–26) control driver 18a which drives the transmission line corresponding to the trinary trit representative of one base three ($1_3$). In a like manner, the bottom group of three control lines (lines 64–66) control driver 18b which drives the transmission line corresponding to the trinary trit representing three base three ($3_3$). The transmission line representing $1_3$ enters binary logic circuit 12 and connects with trinary receiver 21a. Receiver 21a converts the trit representative of $1_3$ into binary voltages appearing on lines 27–29. Lines 27–29 are one group of three lines of the six lines 22 (see FIG. 1). Lines 22 control translator 23 which translates the incoming trits into binary bits ($1_2$, $2_2$, $4_2$) appearing on lines 14. A better understanding can be had with respect to the operation of FIGS. 1 and 2 by presenting a more detailed description of the operation of the individual blocks presented below.

Referring to FIG. 3, a hardware logic diagram is shown for the binary to trinary converters 16 of FIGS. 1 and 2. Binary signals $1_2$, $2_2$, and $4_2$ appear on lines 31–33 respectively. Inverters 34–36 produce the compliments of signals $1_2$, $2_2$, and $4_2$ on lines 37–39 respectively. The hardware configuration of AND gates, OR gates, and inverters shown in FIG. 3 is arrived at by application of the Karnaugh-map method, known in the art. OR gate 57 combines the outputs of AND gates 41–43 to produce a signal on line 24 which is high when trit 1 ($T_1$), representing $1_3$, takes the value "1". In a like manner OR gate 58 combines the outputs of AND gates 44 and 46 to produce, on line 25, a high level when $T_1=2$. To complete the possible states of $T_1$, OR gate 59 combines the outputs of AND gates 47–49 to produce, on line 26, a high state when $T_1=0$. It should be noted that the HIGH signals appearing on lines 24–26 are mutually exclusive.

Moving on to trit 3 ($T_3$) representing $3_3$, OR gate 61 combines the outputs of AND gates 51 and 52 to produce, on line 64 a HIGH level when $T_3=1$. In addition, AND gate 53 produces, on line 65, a HIGH level when $T_3=2$. To complete the possible states of $T_3$, OR gate 63 combines the outputs of AND gates 54 and 56 to produce, on line 66, a HIGH level when $T_3$ takes the value "0". To express the above relationships in terms of mathematical equations:

$$(T_1=1)=\bar{A}\bar{B}C+ABC+A\bar{B}\bar{C}$$

$$(T_1=2)=\bar{A}B\bar{C}+A\bar{B}C$$

$$(T_1=0)=\bar{A}\bar{B}\bar{C}+\bar{A}BC+AB\bar{C}$$

$$(T_3=1)=A\bar{B}+\bar{A}BC$$

$$(T_3=2)=AB$$

$$(T_3=0)=\bar{A}\bar{B}+\bar{A}C$$

Where: A, B, and C are the bit values $1_2$, $2_2$, and $4_2$, respectively.

It should be noted that the particular hardware embodiment disclosed in FIG. 3 should not be construed to delimit the invention in any manner. It will be understood, by one skilled in the art, that any hardware implementation that accomplishes the results presented by the above equations for $T_1$ and $T_3$ would accomplish the objects of the invention. It should also be noted that the detailed circuit schematic for FIG. 3 can be realized in any circuit technology (e.g., MOSFET, bipolar, etc.).

In FIG. 3, the outputs of inverters 62, and 68–72, provide the complements of the control signals indicative of the three states of each of $T_1$ and $T_3$. These complemented outputs are used by only some of the subsequent driver stages and are shown for completeness. It will be understood, by those skilled in the art, that if the subsequent driver stage does not require a complimented input signal, the appropriate inverter may be eliminated from the converter of FIG. 3.

Finally, each of AND gates 41–44, 46–49, 51–54, and 56 has, as an input, an enable signal appearing on line 73.

When line 73 is enabled (HIGH), all AND gates function normally. However, when the enable signal on line 73 is LOW, no signals are passed by any AND gates and, as a result, all uncomplimented outputs of the binary to trinary converter will be LOW. This feature can then be used, as described below, to effectively disable a subsequent driver stage. It should be noted, however, that other embodiments of the invention do not require that the binary to trinary converter of FIG. 3 be disabled at any time and, therefore, enable line 73 can be eliminated in those embodiments.

Figure 5:
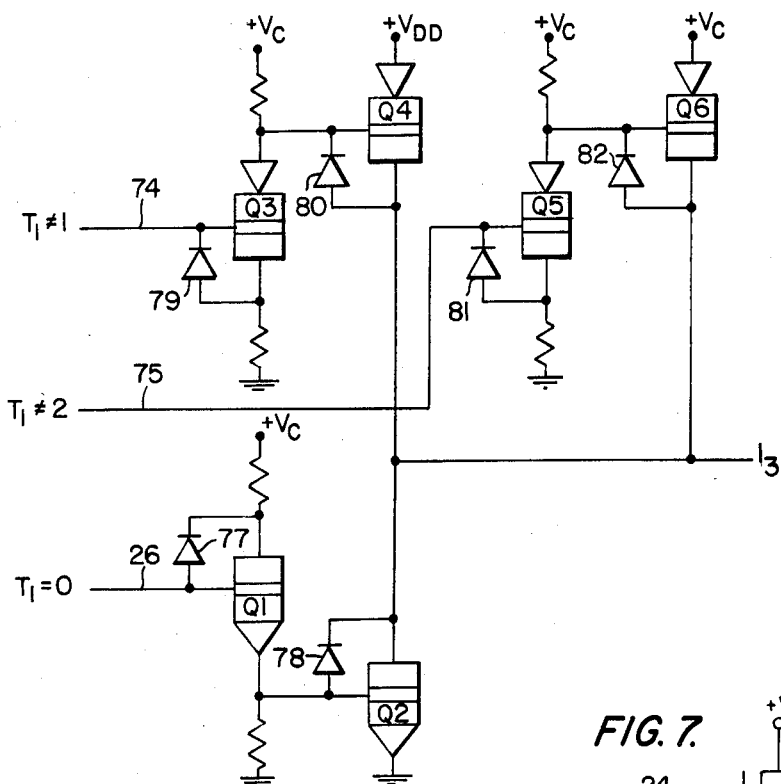
FIG. 5 is a detailed schematic of a hardware implementation of a bipolar trinary driver which can be used in FIGS. 1 and 2.
Figure 6:
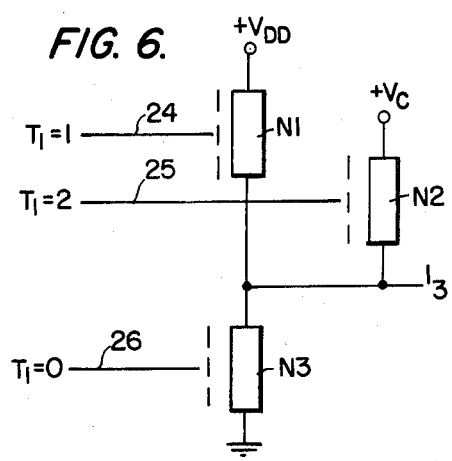
FIG. 6 is a detailed schematic of a hardware implementation of a N-channel enhancement mode MOSFET trinary driver which can be used in FIGS. 1 and 2.
Figure 7:
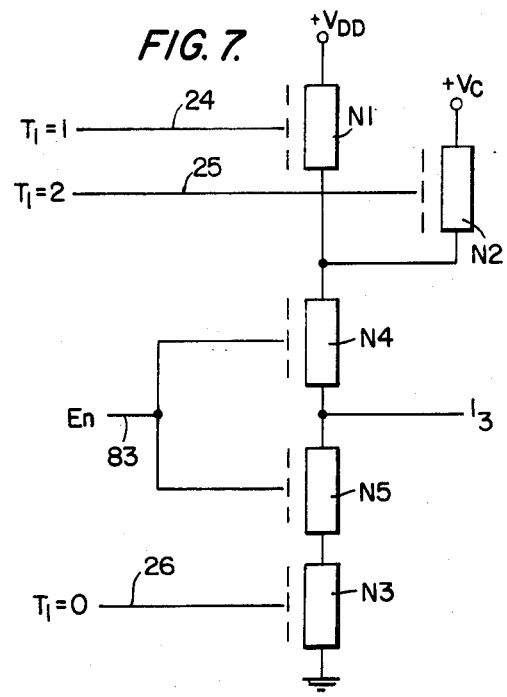
FIG. 7 is a detailed schematic of a hardware implementation of a trinary driver similar to FIG. 6 with the addition of an enable input.

FIGS. 5-7 disclose detailed circuit schematics for trinary drivers 18A and 18B of FIG. 2. For the purposes of illustration, FIGS. 5-7 will be described with reference to driver 18A, but, it will be understood that driver 18B, or half of any driver 18 in FIG. 1, can also be implemented this way.

The bipolar trinary driver of FIG. 5 accepts, as inputs, binary signals on lines 74, 75, and 26 indicative of the complements of signals $T_1=1$, $T_1=2$, and the uncomplemented signal $T_1=0$, respectively. These signals are produced by the top half of the circuit of FIG. 3 described above. When a HIGH signal appears on line 26, indicative of a satisfaction of the condition $T_1=0$, NPN transistors Q1 and Q2 turn ON thereby sinking the output $1_3$ to ground. When the signal on line 26 is LOW, below approximately 1.4 volts, both transistors Q1 and Q2 are OFF and the output $1_3$ is not sunk to ground.

When the input on line 74 is LOW, indicative of a satisfaction of the condition $T_1=1$, PNP transistors Q3 and Q4 turn ON thereby sourcing the output $1_3$ to the voltage $V_{DD}$. When the voltage on line 74 is HIGH, indicative of a satisfaction of the condition $T_1 \neq 1$, transistors Q3 and Q4 are OFF and voltage $V_{DD}$ is not applied to output $1_3$. When the input on line 75 is LOW, indicative of a satisfaction of the condition $T_1=2$, PNP transistors Q5 and Q6 are turned ON thereby sourcing the output $1_3$ to the voltage $V_C$. When the input on line 75 is HIGH, indicative of a satisfaction of the condition $T_1 \neq 2$, neither transistor Q5 or Q6 is ON, and output $1_3$ is not sourced to voltage $V_C$. In the preferred embodiment, voltage $V_{DD}$ takes the value of approximately 5 Volts, and the voltage $V_C$ takes the value $\frac{1}{2} V_{DD}$, or approximately 2.5 Volts.

Therefore, the driver of FIG. 5 places one of three discrete voltage levels (0, 2.5, 5 Volts) on output $1_3$ under control of binary inputs supplied to lines 74, 75 and 26. If enable line 73 (see FIG. 3) is LOW, this will produce HIGH signals on lines 74 and 75 and a LOW signal on line 26. Under this condition, all transistors shown in FIG. 5 will be OFF, and output $1_3$ will assume a high impedance state, or inactive state.

Schottkey barrier diodes 77-82 are connected across the base-collector junction of each of transistors Q1-Q6, respectively. These diodes prevent the respective transistors from saturating thereby increasing the circuit switching speed.

Referring to FIG. 6, N-channel enhancement mode MOSFETs N1-N3 form a trinary driver circuit which accepts, as inputs, the mutually exclusive uncomplemented signals on lines 24-26 (see FIG. 3). A HIGH signal on line 26 will sink the output $1_3$ to ground, a HIGH signal on line 25 will source the output $1_3$ to the voltage $V_C$, and a HIGH signal on line 24 will source the output $1_3$ to VDD Once again, $V_{DD}$ equals approximately 5 volts, and $V_C$ equals approximately 2.5 volts. When no signals appear on any of lines 24-26, which occurs when enable line 73 in FIG. 3 is LOW, output $1_3$ assumes a high-impedance state which is an inactive state.

The trinary driver of FIG. 7 is substantially identical to the driver of FIG. 6 with the addition of enable transistors N5 and N4. When the enable signal on line 83 is HIGH, N-channel enhancement mode MOSFETs N4 and N5 are ON, and the circuit of FIG. 7 operates identical to the circuit of FIG. 6. However, when the enable signal on line 83 is LOW, transistors N4 and N5 are OFF thereby placing output $1_3$ in a high impedance state, which is an inactive state, regardless of the signals appearing on lines 24-26. The enable signal appearing on line 83 performs a function analogous to the enable signal appearing on line 73 of FIG. 3. If the driver shown in FIG. 7 is appended to the circuit of FIG. 3, enable line 73 in FIG. 3 would be redundant and could, therefore, be eliminated.

FIGS. 8-14 present several different embodiments of trinary receivers 21A and 21B of FIG. 2. These receivers will be described with respect to the trit corresponding to $1_3$; however, it will be understood by one skilled in the art that the same receivers can be used for receiver 21B shown in FIG. 2, or for half of any receiver 21 shown in FIG. 1.

Figure 8:
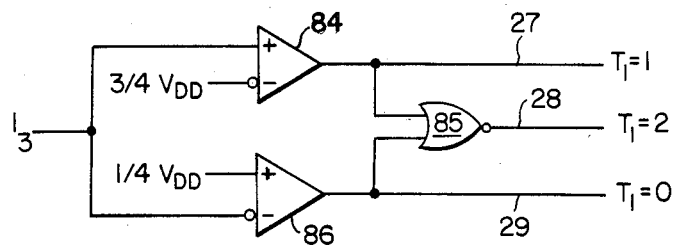
FIG. 8 is a detailed schematic of a hardware implementation of a trinary receiver using differential comparators which can be used in FIGS. 1 and 2.

FIG. 8 is a trinary receiver employing differential comparators. Input $1_3$ is applied to the noninverting input of comparator 84, and to the inverting input of comparator 86. A reference voltage of $\frac{1}{4} V_{DD}$ is applied to the non-inverting input of comparator 86, and a reference voltage of $\frac{3}{4} V_{DD}$ is applied to the inverting input of comparator 84. These reference voltages are generated by circuitry (not shown) which is known in the art. If the voltage on input $1_3$ is less than $\frac{1}{4} V_{DD}$, comparator 86 produces a HIGH signal on line 29 indicating that trit input $1_3$ takes the value "0". If input $1_3$ is greater than $\frac{3}{4} V_{DD}$, comparator 84 produces a HIGH signal on line 27 indicating that trit input $1_3$ takes the value "1". Should trit input $1_3$ be between $\frac{1}{4} V_{DD}$ and $\frac{3}{4} V_{DD}$, neither line 27 nor line 29 is HIGH, thereby satisfying NOR gate 85 producing a HIGH state on line 28 indicating that trit $1_3$ takes the value "2". It is evident, therefore, that the signals on lines 27-29 are mutually exclusive and are indicative of the states $T_1=1$, $T_1=2$, and $T_1=0$, respectively.

Figure 9:
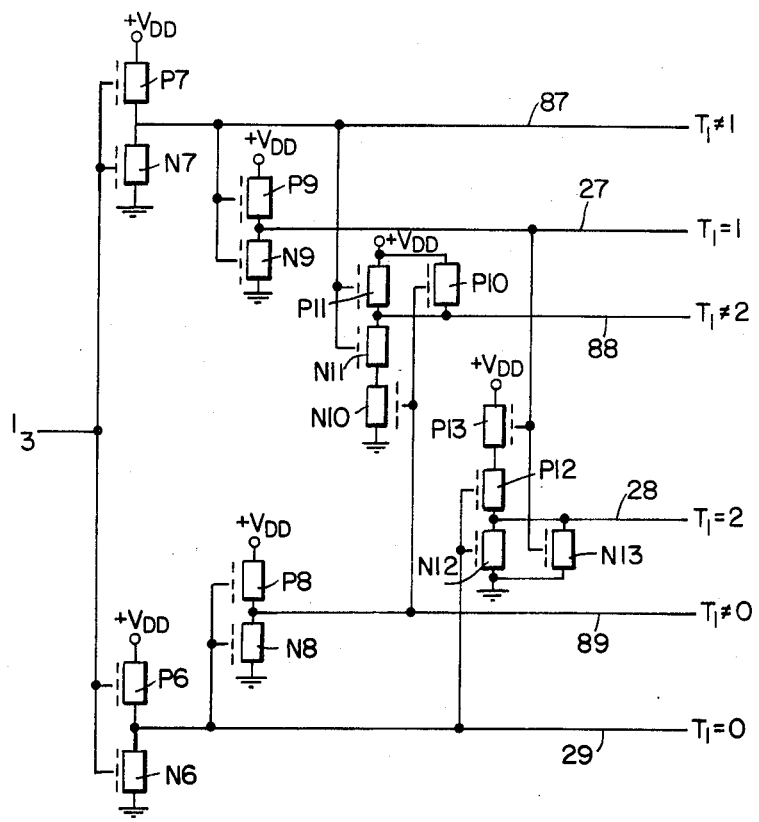
FIG. 9 is a detailed schematic of a hardware implementation of a CMOS trinary receiver which can be used in FIGS. 1 and 2.

FIG. 9 is a trinary receiver employing enhancement mode CMOS technology. For this embodiment, the threshold voltage for N-channel transistor N6 is approximately $\frac{1}{4} V_{DD}$ relative to ground, and the threshold voltage for P-channel transistor P6 is approximately $-\frac{3}{4} V_{DD}$ relative to $V_{DD}$. This relationship allows transistor N6 and transistor P6 to each switch substantially simultaneously when a voltage of $\frac{1}{4} V_{DD}$ relative to ground is applied to their respective gates. In addition, N-channel transistor N7 has a threshold voltage of approximately $\frac{3}{4} V_{DD}$ relative to ground, and P-channel transistor P7 has a threshold voltage of approximately $-\frac{1}{4} V_{DD}$ relative to $V_{DD}$. This allows the transistor pair N7, P7 to each switch substantially simultaneously when a voltage of approximately $\frac{3}{4} V_{DD}$, relative to ground, is applied to their respective gates. All remaining N-channel transistors in FIG. 9 have a threshold voltage of approximately $\frac{1}{4} V_{DD}$ relative to ground, and all remaining P-channel transistors in FIG. 9 have a threshold voltage of approximately $-\frac{3}{4} V_{DD}$ relative to $V_{DD}$.

To describe the operation of the circuit of FIG. 9, the state of each of the transistors will be described for each of the three possible states appearing at input $1_3$. When input 1₃ is grounded, reflecting a value $T_1=0$, transistors N6 and N7 are both OFF, and transistors P6 and P7 are both ON. P6 sources $V_{DD}$ to line 29 producing a HIGH signal. The HIGH level on line 29 is inverted by the combination of transistors N8 and P8 to produce a LOW signal on line 89. A HIGH signal on line 29 with a LOW signal on line 89 indicates that the condition $T_1=0$ has been sensed. Continuing with a description of the generation of the remaining signals when $T_1=0$, transistor P7 sources $V_{DD}$ to line 87, producing a HIGH signal, which is inverted by transistor pair P9, N9 to produce a LOW signal on line 27. A HIGH signal on line 87 with a LOW signal on line 27 indicates that the condition $T_1=1$ has not been sensed, which is correct. The signals on lines 87 and 89 are NANDed by the circuit comprising transistors N10, N11, P10, and P11. Since line 89 is LOW, the above described NANDing produces a HIGH signal on line 88. Finally, transistors N12, N13, P12, and P13 form a NOR gate with lines 27 and 29 as inputs and line 28 as an output. Since line 29 is HIGH, this NOR gate produces a LOW signal on line 28. A HIGH signal on line 88 with a LOW signal on line 28 indicates that the condition $T_1=2$ has not been sensed, which is correct.

When signal 1₃ of FIG. 9 takes the value "1", the gates of transistors N6, P6, N7, and P7 are at a potential approximately equal to $V_{DD}$ relative to ground. This turns both N6 and N7 ON, and turns both P6 and P7 OFF. With N6 ON, line 29 is sunk to ground potential, and this signal is inverted by the combination of transistors N8 and P8 to produce a HIGH level on line 89. A LOW signal on line 29 with a HIGH signal on line 89 indicates that the condition $T_1=0$ has not been sensed, which is correct. In addition, N7 being ON sinks line 87 to ground potential, and this signal is inverted by the combination of transistor N9 and P9 to produce a HIGH level on line 27. A HIGH signal on line 27 with a LOW signal on line 87 indicates that the condition $T_1=1$ has been sensed, which is correct. The NAND gate comprising transistors N10, N11, P10, and P11 combines the HIGH signal on line 89 and the LOW signal on line 87 to produce a HIGH signal on line 88. Finally, the NOR gate comprising transistors N12, N13, P12, and P13 combines the LOW signal on line 29 and the HIGH signal on line 27 to produce a LOW signal on line 28. A HIGH signal on line 88 with a LOW signal on line 28 indicates that the condition $T_1=2$ has not been sensed, which is correct.

Finally, when the voltage on line 1₃ of FIG. 9 assumes a potential midway between $V_{DD}$ and ground, indicating the condition $T_1=2$, transistors N6 and P7 are both ON, while transistors P6 and N7 are both OFF. This produces a LOW signal on line 29 which is inverted by the combination of transistors N8 and P8 to produce a HIGH level on line 89. A LOW signal on line 29 with a HIGH signal on line 89 indicates that the condition $T_1=0$ has not been sensed. In addition, line 87 is sourced to voltage $V_{DD}$ through transistor P7, and this signal is inverted by the combination of transistors N9 and P9 to produce a LOW level on line 27. A HIGH signal on line 87 with a LOW signal on line 27 indicates that the condition $T_1=1$ has not been sensed. The NAND gate comprising transistors N10, N11, P10 and P11 combines the HIGH signal on line 89 and the HIGH signal on line 87 to produce a LOW signal on line 88. Finally, the NOR gate comprising transistors N12, N13, P12, and P13 combine the LOW signal on line 27 with the LOW signal on line 29 to produce a HIGH signal on line 28. A LOW signal on line 88 with a HIGH signal on line 28 indicates that the condition $T_1=2$ has been sensed.

Here it should be noted that all true signals (i.e., $T_1=0, 1, 2$) as well as complemented signals (i.e., $T_1 \neq 0,1,2$) are produced by the circuit of FIG. 9. Depending on the structure of the subsequent translator (item 23, FIGS. 1 and 2), not all of the signals may be required. It will be understood, by those skilled in the art, that only those signals required by the subsequent translator need be generated, and that circuitry generating unrequired signals may be eliminated.

Figure 10:
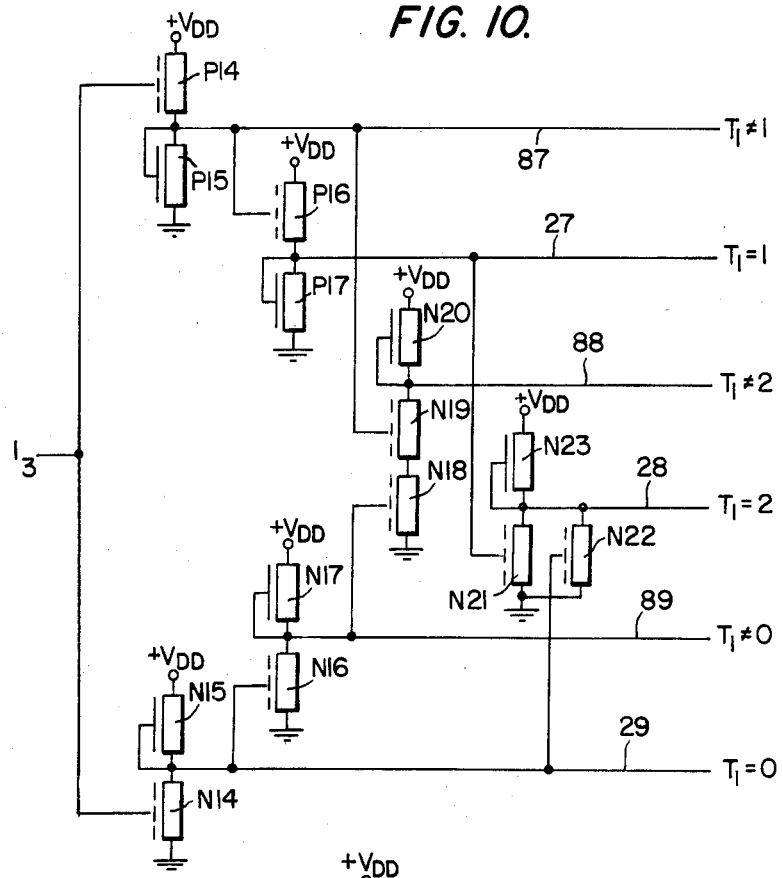
FIG. 10 is a detailed schematic of a hardware implementation of a MOSFET trinary receiver which can be used in FIGS. 1 and 2.

Referring to FIG. 10, a trinary MOSFET receiver is presented using both P-channel and N-channel, enhancement mode and depletion mode devices. As used herein, enhancement mode devices are shown with a broken gate, depletion mode devices are shown with a solid gate, and N-channel and P-channel devices are shown with a N or P preceding a respective numeral designator. All depletion mode transistors in FIG. 10 (N15, P15, N17, P17, N20, and N23) are configured as active loads which switch from a high to a low drain-to-source impedance whenever the respective enhancement mode transistors switch from a low to a high drain-to-source impedance, and vice versa.

When the input signal 1₃ of FIG. 10 takes the value "0", or ground potential, transistor N14 is OFF and line 29 is pulled HIGH by active load N15. A HIGH signal on line 29 turns transistor N16 ON thereby turning transistor active load N17 OFF and pulling line 89 LOW. A LOW signal on line 89 with a HIGH signal on line 29 indicates that a logical "0" has been sensed on input 1₃. In addition, a LOW signal on 1₃ turns transistor P14 ON which pulls lines 87 HIGH and which turns transistor P15 OFF. A HIGH signal on line 87 is inverted by the combination of enhancement mode transistor P16 and depletion mode transistor P17 to produce a LOW signal on line 27. A HIGH signal on line 87 and a LOW signal on line 27 indicates that a logical "1" has not been sensed on input 1₃. Depletion mode transistor N20 combines with enhancement mode transistors N18 and N19 to provide a NAND gate with lines 87 and 89 as inputs, and line 88 as an output. Since, for $T_1=0$, line 89 is LOW and line 87 is LOW, transistors N18 and N19 are OFF and transistor N20 sources $V_{DD}$ to line 88 producing a HIGH signal. Enhancement mode transistors N21 and N22 combine with depletion mode transistor N23 to produce a NOR gate with lines 29 and 27 as inputs and line 28 as an output. Since line 29 is HIGH, the NOR gate produces a LOW signal on line 28. A LOW signal on line 28 and a HIGH signal on line 88 indicates that the state $T_1=2$ has not been detected, which is correct.

When signal 1₃ of FIG. 10 is a "1", a voltage approximately equal to $V_{DD}$ is applied to the gates of transistors N14 and P14 relative to ground. A voltage of $V_{DD}$ applied to the gate of transistor P14 turns that transistor OFF, and line 87 is pulled LOW through transistor P15 configured as an active load. Transistors P16 and P17, acting in combination as an inverter, invert the signal on line 87 to produce a HIGH signal on line 27. A HIGH signal on line 27 and a LOW signal on line 87 indicates that the state $T_1=1$ has been detected, which is correct. A positive voltage on the gate of transistor N14 turns transistor N14 ON, which pulls line 29 to ground. The grounded signal on line 29 is inverted by the combination of transistor N16 and N17 to produce a HIGH signal on line 89. A HIGH signal on line 89 and a LOW signal on line 29 indicate that the state $T_1=0$ has not been detected, which is correct. The NAND gate comprised of transistors N18, N19, and N20 operates on the HIGH signal on line 89 and the LOW signal on line 87 to produce a HIGH signal on line 88. Finally, the HIGH signal on line 27 and the LOW signal on line 29 are combined by the NOR gate comprised of transistors N21, N22, and N23, to produce a LOW signal on line 28. A HIGH signal on line 88 and a LOW signal on line 28 indicate that the state $T_1=2$ has not been detected, which is correct.

Finally, the operation of FIG. 10 will be discussed considering that the input signal $1_3$ takes the value "2" which corresponds to a voltage level equal to approximately $\frac{1}{2}V_{DD}$. Here, both transistors N14 and P14 turn ON producing HIGH levels on lines 87 and 89, and LOW levels on lines 27 and 29. These signals indicate the absence of the detection of the states $T_1=0$, or $T_1=1$, which is correct. The NAND gate comprising transistors N18, N19 and N20 combines the two HIGH signals on lines 87 and 89 to produce a LOW signal on line 88. In addition, the NOR circuit of transistors N21, N22, and N23 combines the two LOW signals on lines 27 and 29 to produce a HIGH signal on line 28. A LOW signal on line 88 and a HIGH signal on line 28 indicates the presence of the state $T_1=2$, which is correct.

Finally, with reference to FIG. 10, it again should be emphasized that not all true and complemented outputs produced by the receiver circuit of FIG. 10 may be required by a subsequent translator. One skilled in the art will understand that, if the subsequent translator does not require all signals produced by FIG. 10, the unrequired signals, and circuits producing those signals, may be deleted without deviating from the intent and scope of the present invention.

In some cases it may be desirable to provide faster receiver circuits (half of item 21, FIG. 1, or items 21a, 21b, FIG. 2) in a given circuit application. This can be accomplished by reducing the propagation delay of the receiver circuits which is made possible by eliminating certain signals produced by the receiver.

Figure 11:
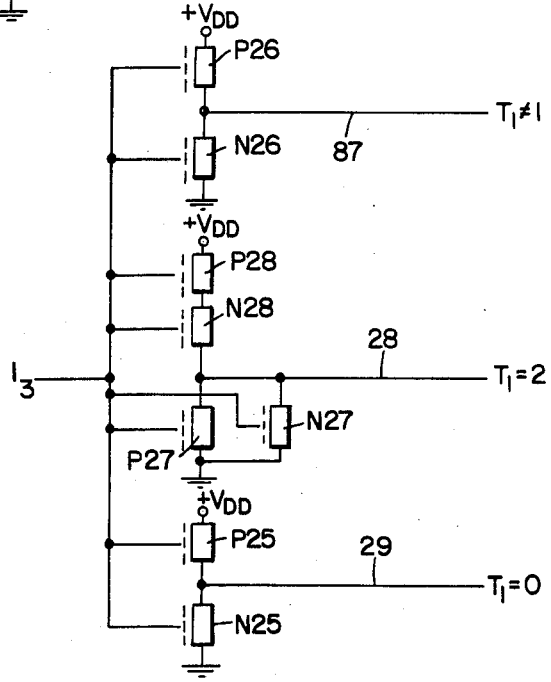
FIG. 11 is a detailed schematic of a hardware implementation of a CMOS trinary fast receiver that can be used in FIGS. 1 and 2.

One such fast receiver is shown in the CMOS circuit of FIG. 11. The fast receiver circuit of FIG. 11 senses line $1_3$ for three discrete voltage levels and produces three output signals ($T_1 \neq 1$, $T_1=2$, and $T_1=0$). To accomplish this, the complementary enhancement mode transistor pairs employ different gate threshold voltages. The threshold voltages of transistors P26 and P28 are $-\frac{1}{4}V_{DD}$ relative to $V_{DD}$; the threshold voltages of transistors P25 and P27 are $-\frac{3}{4}V_{DD}$ relative to $V_{DD}$; the threshold voltages of transistors N26 and N27 are $+\frac{3}{4}V_{DD}$ relative to ground; and the threshold voltages of transistors N25 and N28 are $+\frac{1}{4}V_{DD}$ relative to ground.

With a logic level of "0", or ground potential, on line $1_3$ of FIG. 11, all N-channel FETs are OFF, and all P-channel FETs are ON. Therefore, line 87 is sourced to $V_{DD}$ by transistor P26 indicating that $T_1 \neq 1$ has been sensed (in other words, $T_1=1$ has not been sensed). Line 28 is sunk to ground potential by transistor P27 indicating that the condition $T_1=2$ has not been sensed, and line 29 is sourced to $V_{DD}$ by transistor P25 indicating that the state $T_1=0$ has been sensed.

For a logic level of "1", or a potential of $V_{DD}$, on input line $1_3$ of FIG. 11, all P-channel FETs are OFF and all N-channel FETs are on. Therefore, line 87 is sunk to ground through transistor N26 indicating that the state $T_1 \neq 1$ has not been sensed (in other words, $T_1=1$ has been sensed), line 28 is sunk to ground by transistor N27 indicating that the state $T_1=2$ has not been sensed, and line 29 is sunk to ground by transistor N25 indicating that the state $T_1=0$ has not been sensed.

For a logical input on line $1_3$ of FIG. 11 of "2", or a potential of approximately $\frac{1}{2}V_{DD}$, P-channel FETs P26 and P28 as well as N-channel FETs N25 and N28 are ON, and P-channel FETs P25 and P27 as well as N-channel FETs N26 and N27 are OFF. Therefore, line 87 is sourced to $V_{DD}$ by transistor P26 indicating that the condition $T_1 \neq 1$ has been sensed, line 28 is sourced to $V_{DD}$ by transistors N28 and P28 indicating that the state $T_1=2$ has been sensed, and line 29 is sunk to ground by transistor N25 indicating that the condition $T_1=0$ has not been sensed.

To compare the relative speeds of the circuit of FIG. 11 with the circuits of FIGS. 9 or 10, the production of an output indicative of a detection of the state $T_1=2$ is discussed. Each of the circuits of FIGS. 9 or 10 requires the input signal to propagate through three transistor stages before producing a correct output on line 28 ($T_1=2$). In direct contrast, the circuit of FIG. 11 requires the propagation of the input signal through only one transistor stage thereby reducing the propagation delay to approximately one-third that of the circuits of FIGS. 9 or 10.

Figure 12:
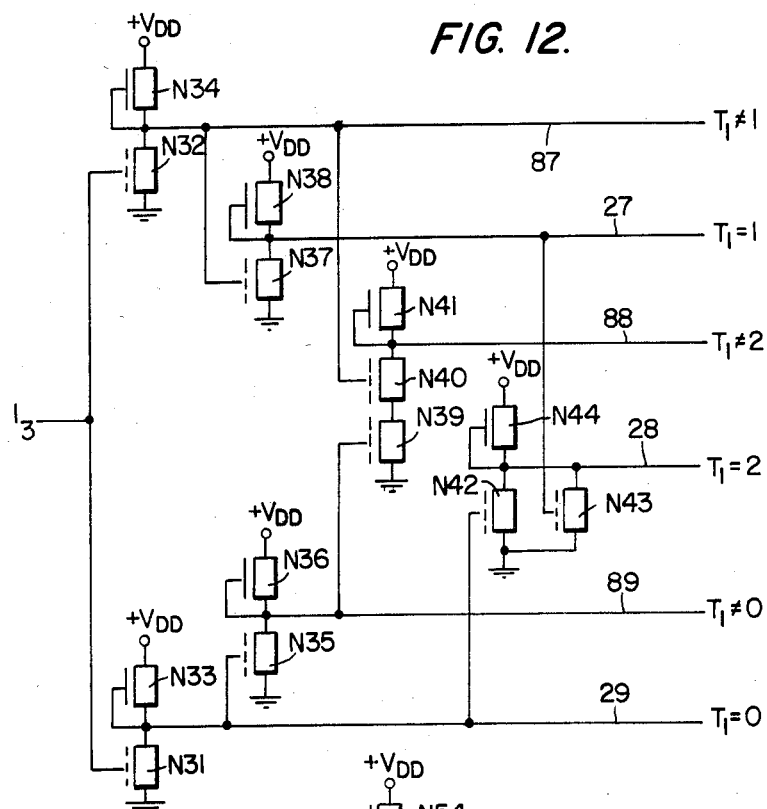
FIG. 12 is a detailed schematic of a hardware implementation of a N-channel MOSFET trinary receiver which can be used in FIGS. 1 and 2.

Referring to FIG. 12, a trinary receiver circuit comprising exclusively N-channel MOSFETs is presented which, similar to the circuits of FIGS. 9 and 10, produces three true and three complemented outputs. Enhancement mode transistor N31 as well as N35, N37, N39, N40, N42, and N43 have a gate threshold voltage of $+\frac{1}{4}V_{DD}$ relative to ground. Enhancement mode transistor N32 has a gate threshold voltage of approximately $+\frac{3}{4}V_{DD}$ relative to ground. All depletion mode transistors (N33, N34, N36, N38, N41, and N44) perform the function of active loads which switch from a high to a low drain-to-source resistance whenever the paired enhancement mode transistor switches from a low to a high resistance, and vice versa.

For a logical input of "0", or ground potential, on input $1_3$ of FIG. 12, transistor N31 is OFF and line 29 is sourced to $V_{DD}$ by active load transistor N33. The HIGH signal on line 29 is inverted by transistor pair N35 and N36 to produce a LOW signal on line 89. A HIGH signal on line 29 with a LOW signal on line 89 indicates that the condition $T_1=0$ has been sensed. A ground potential on line $1_3$ also turns transistor N32 OFF and line 87 is sourced to $V_{DD}$ through transistor active load N34. The HIGH signal on line 87 is inverted by the transistor pair N37 and N38 to produce a LOW signal on line 27. A HIGH signal on line 87 with a LOW signal on line 27 indicates that the state $T_1=1$ has not been sensed. The HIGH state on line 87 is combined with the LOW state on line 89 by a NAND gate comprising transistors N39, N40, and N41, to produce a HIGH signal on line 88. The LOW signal on line 27 is combined with the HIGH signal on line 29 by a NOR gate comprising transistors N42, N43, and N44, to produce a LOW state on line 28. A HIGH state on line 88 with a LOW state on line 28 indicates that the condition $T_1=2$ has not been sensed.

With a logic signal of "1", or a potential substantially equal to $V_{DD}$, on line $1_3$ of FIG. 12 both transistors N31 and N32 are ON pulling lines 29 and 87, respectively, to ground potential. The LOW signal on line 87 is inverted by the transistor pair N37 and N38 to produce a HIGH signal on line 27. A HIGH signal on line 27 with a LOW signal on line 87 indicates that the condition $T_1=1$ has been sensed. The LOW signal on line 29 is inverted by transistor pair N35 and N36 to produce a HIGH signal on line 89. A HIGH signal on line 89 with a LOW signal on line 29 indicates that the state $T_1=0$ has not been detected. The LOW signal on line 87 is combined with the HIGH signal on line 89 by the NAND circuit of transistors N39, N40, and N41 to produce a HIGH signal on line 88. The HIGH signal on line 27 is combined with the LOW signal on line 29 by the NOR gate of transistors N42, N43, and N44 to produce a LOW signal on line 28. A LOW signal on line 28 with a HIGH signal on line 88 indicates that the condition $T_1=2$ has not been sensed.

For a logical state of "2", or a potential approximately equal to $\frac{1}{2}V_{DD}$ on input line $1_3$ of FIG. 12, transistor N31 is ON, and transistor N32 is OFF. Transistor N31 pulls line 29 to ground potential, and this LOW signal is inverted by transistor pair N35 and N36 to produce a HIGH signal on line 89. A HIGH signal on line 89 with a LOW signal on line 29 indicates that the condition $T_1=0$ has not been detected. With transistor N32 OFF, line 87 is pulled HIGH by transistor active load N34. This HIGH signal is inverted by transistor pair N37 and N38 to produce a LOW signal on line 27. A LOW signal on line 27 with a HIGH signal on line 87 indicates that the condition $T_1=1$ has not been detected. The HIGH signal on line 87 is combined with the HIGH signal on line 89 by the NAND gate comprising transistors N39, N40, and N41 to produce a LOW signal on line 88. The LOW signal on line 27 is combined with the LOW signal on line 29 by the NOR gate comprising transistors N42, N43, and N44 to produce a HIGH signal on line 28. A HIGH signal on line 28 with a LOW signal on line 88 indicates that the condition $T_1=2$ has been detected.

Figure 13:
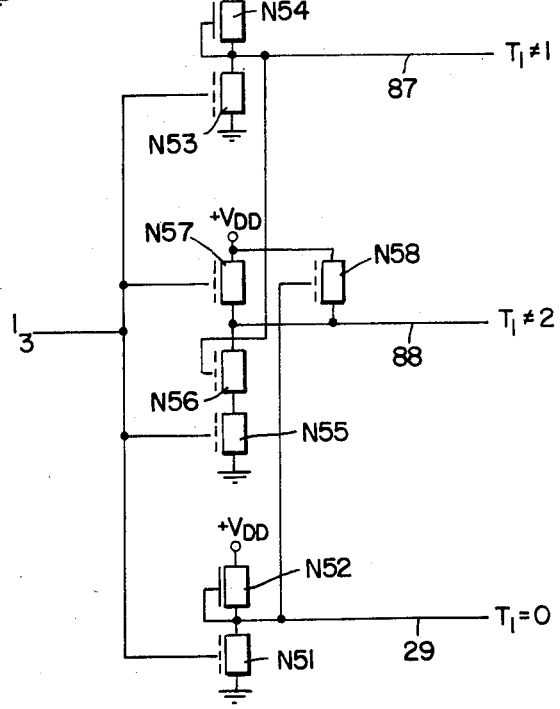
FIG. 13 is a schematic of a hardware implementation of a N-channel trinary MOSFET fast receiver which can be used in FIGS. 1 and 2.

Referring now to FIG. 13, a fast trinary receiver constructed exclusively of N-channel MOSFETs is presented. Similar to FIG. 11, FIG. 13 reduces propagation delay by using two different gate threshold voltages for transistors within the circuit, and by producing only three outputs ($T_1 \neq 1$, $T_1 \neq 2$, and $T_1 = 0$). The gate threshold voltages of transistors N51, N55, N56, and N58 are $+\frac{1}{4}V_{DD}$ relative to ground. The gate threshold voltages of transistors N53 and N57 are $+\frac{3}{4}V_{DD}$ relative to ground. Similar to the depletion mode transistors described with reference to FIG. 12, depletion mode transistors N52 and N54 operate as active loads which switch from a high to a low drain-to-source resistance whenever the paired enhancement mode transistor switches from a low to a high resistance, and vice versa.

With a logic level of "0", or ground potential, applied to line $1_3$ of FIG. 13, N-channel enhancement mode transistors N51, N53, N55, and N57 are all OFF. As a result, lines 29 and 87 are sourced to $V_{DD}$ by transistor active loads N52, and N54, respectively. A HIGH signal on line 29 indicates that the condition $T_1=0$ has been sensed. Likewise, a HIGH state on line 87 indicates that the condition $T_1 \neq 1$ has also been sensed (in other words, the condition $T_1=1$ has not been sensed). A HIGH condition on line 29 turns transistor N58 ON which sources $V_{DD}$ to line 88. A HIGH state on line 88 indicates that the condition $T_1 \neq 2$ has been detected (in other words, the condition $T_1=2$ has not been detected).

With a logic level of "1", or a potential approximately equal to $V_{DD}$, applied to line $1_3$ of FIG. 13, enhancement mode transistors N51, N53, N55, and N57 are all ON. Transistor N51 sinks line 29 to ground potential indicating that the condition $T_1=0$ has not been sensed. Transistor N53 sinks line 87 to ground potential indicating that the condition $T_1 \neq 1$ has not been sensed (in other words, the condition $T_1=1$ has been sensed). Line 88 is sourced to $V_{DD}$ by transistor N57 indicating that the condition $T_11 \neq 2$ has been sensed (in other words, the condition $T_1=2$ has not been sensed).

When a logical level of "2", or a potential substantially equal to $\frac{1}{2}V_{DD}$, is applied to line $1_3$ of FIG. 13, transistors N51 and N55 are ON, and transistors N53 and N57 are OFF. Line 29 is sunk to ground potential by transistor N51 indicating that the condition $T_1=0$ has not been sensed. Line 87 is sourced to $V_{DD}$ by transistor active load N54 indicating that the condition $T_1 \neq 1$ has been sensed (in other words, the condition $T_1=1$ has not been sensed). A HIGH condition on line 87 turns transistor N56 ON and line 88 is pulled to near ground potential by the series combination of transistors N55 and N56. A LOW condition on line 88 indicates that the state $T_1 \neq 2$ has not been sensed (in other words, the condition $T_1=2$ has been sensed).

Figure 14:
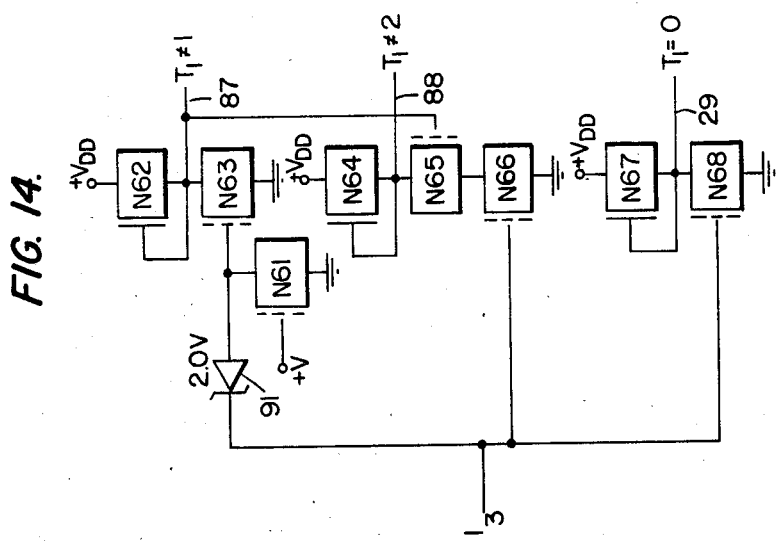
FIG. 14 is a detailed schematic of a hardware implementation of a Zener, single threshold, MOSFET trinary receiver which can be used in FIGS. 1 and 2.

Referring now to FIG. 14, a trinary receiver using single threshold N-channel MOSFET devices in combination with a Zener diode is disclosed. All depletion mode devices (N62, N64, and N67) are configured as active loads which switch from a high to a low drain-to-source impedance in converse relationship to the MOSFET for which each active load transistor is providing a load. Zener diode 91 and transistor N61 together comprise a circuit which provides a voltage threshold for transistors N62 and N63. A voltage $+V$ is applied to the gate of transistor N61 in order to provide a constant drain-to-source impedance of transistor N61 sufficient to maintain diode 91 in Zener breakdown operation when diode 91 is back biased.

When a logic level of "0", or ground potential is applied to input $1_3$ of FIG. 14, transistors N63, N66, and N68 are OFF. Lines 29 and 87 are sourced to $V_{DD}$ through active loads 67 and 62, respectively. The HIGH signal on line 29 indicates that the state $T_1=0$ has been sensed, and the HIGH signal on line 87 indicates that the state $T_1 \neq 1$ has also been sensed (in other words, the state $T_1=1$ has not been sensed). Since transistor N66 is OFF, active load N64 sources $V_{DD}$ to line 88 indicating that the state $T_1 \neq 2$ has been sensed (in other words, the state $T_1=2$ has not been sensed).

When a logic level of "1," or a potential approximately equal to $V_{DD}$ (5 Volts), is applied to input $1_3$ of FIG. 14, Zener diode 91 is back biased thereby applying 3 Volts ($V_{DD}$ less the Zener drop of 2.0 Volts) to the gate of transistor N63. This turns transistor N63 ON and sinks line 87 to ground potential indicating that the state $T_1 \neq 1$ has not been sensed (in other words, the state $T_1=1$ has been sensed). A LOW state on line 87 turns transistor N65 OFF and line 88 is sourced to $V_{DD}$ through active load N64. This HIGH signal on line 88 indicates that the state $T_1 \neq 2$ has been sensed (in other words, the state $T_1=2$ has not been sensed). In addition, transistor N68 turns ON thereby sinking line 29 to ground potential indicating that the state $T_1=0$ has not been sensed.

When a logic level of "2", or a potential equal approximately $\frac{1}{2}V_{DD}$ (2.5 Volts) is applied to input $1_3$ of FIG. 14, Zener diode 91 is back biased thereby applying 0.5 Volts (2.5 Volt input less the 2.0 Volt Zener drop) to the gate of transistor N63. This gate voltage is below the threshold voltage of transistor N63 and transistor N63 is, therefore, OFF and line 87 is sourced to $V_{DD}$ through active load N62. A HIGH signal on line 87 indicates that the state $T_1 \neq 1$ has been sensed (in other words, the state $T_1 = 1$ has not been sensed). Transistor N66 is turned ON by the voltage applied to its gate, and transistor N65 is turned ON by the HIGH signal on line 87. The series combination of transistors N65 and N66 sinks line 88 to ground potential indicating that the state $T_1 \neq 2$ has not been sensed (in other words, the state $T_1 = 2$ has been sensed). Finally, transistor N68 is turned ON by the voltage applied to its gate thereby sinking line 29 to ground potential and indicating that the state $T_1 = 0$ has not been sensed.

Figure 15:
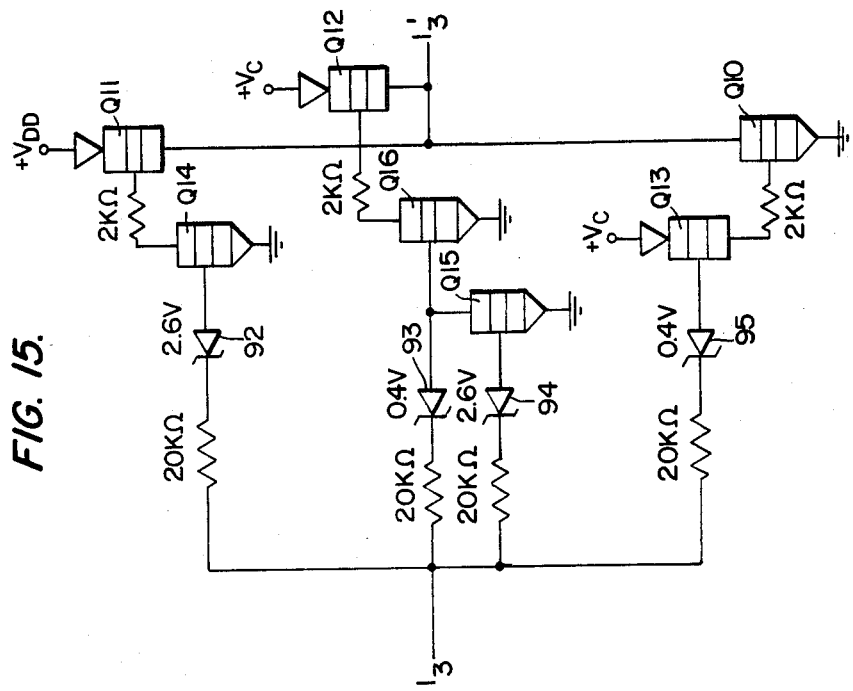
FIG. 15 is a detailed schematic of a hardware implementation of a bipolar trinary receiver and power amplifier according to the invention.

Referring to FIG. 15, a bipolar trinary receiver and power amplifier is disclosed that receives a single trinary input ($1_3$) and produces a single trinary output ($1_3'$) with amplified power capabilities. The circuit of FIG. 15 can be used in the circuits of FIGS. 1 or 2 when lines 19 must travel long distances thereby increasing IR drops and degrading the signals on lines 19. The circuit of FIG. 15 can be included at a point along the length of each of lines 19 to boost the transmitting power and, thus, boost the transmitting distance.

When a trinary logic level of "0", or ground potential, is applied to input $1_3$ of FIG. 15, all transistors are OFF with the exception of transistors Q13 and Q10. Ground potential on input $1_3$ turns PNP transistor Q13 ON through forward biased Zener diode 95 which, in turn, turns NPN transistor Q10 ON. This sinks output $1_3'$ to ground potential.

When a voltage of $V_{DD}$, or a potential of 5 Volts, is applied to input $1_3$ of FIG. 15, Zener diode 95 is back biased thereby turning transistors Q13 and Q10 OFF. In addition, Zener diode 94 is also back biased thereby turning NPN transistor Q15 ON. With transistor Q15 ON, base drive is removed from transistors Q16 and Q12 and both of those transistors are OFF. Finally, Zener diode 92 is back biased thereby turning NPN transistor Q14 and PNP transistor Q11 ON. This sources $V_{DD}$ to output $1_3'$.

With a trinary logic input of "2", or a potential of approximately 2.5 Volts, applied to input $1_3$ of FIG. 15, Zener diodes 92 and 94 are not back biased, and Zener diodes 93 and 95 are back biased. Therefore, transistors Q10, Q11, Q13, and Q14, are all OFF. With Zener diode 93 back biased, PNP transistor Q16 and NPN transistor Q12 both turn ON thereby sourcing output $1_3'$ to the voltage $V_C$ or 2.5 Volts.

Figure 4:
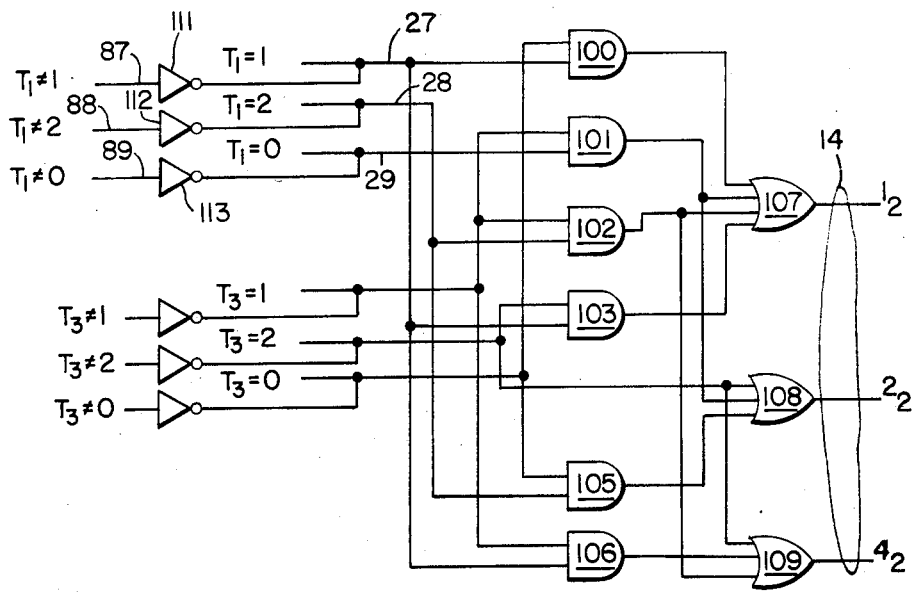
FIG. 4 is a logic diagram of a hardware implementation of the trinary to binary translator of FIGS. 1 and 2.

Referring finally to FIG. 4, a hardware logic diagram is shown for the trinary to binary translators 23 of FIGS. 1 and 2. The trinary to binary translator accepts, as inputs, signals generated by trinary receivers 21A and 21B shown in FIG. 2, specific embodiments of which have been presented in FIGS. 8-14 with the accompanying description. The top half of the circuit of FIG. 4 receives, on lines 27-29 binary signals indicative of the states $T_1 = 1$, $T_1 = 2$, and $T_1 = 0$, respectively. Should the preceding receiver stage produce other than uncomplemented signals, for example, the circuits of FIGS. 11, 13 and 14, inverters 111-113 could be added to the circuit of FIG. 4 to allow the trinary to binary translator to accept complemented signals ($T_1 \neq 1, 2, 0$). The lower portion of the circuit of FIG. 4 is configured to accept signals generated, for example, by receiver 21B of FIG. 2, and indicative of the three states of trit $T_3$.

It will be understood by those skilled in the art that some or all of the inverters shown in FIG. 4 may not be necessary depending on the specific configuration of the preceding receiver circuit. For example, if the receiver circuit of FIG. 13 were attached to the top portion of the circuit of FIG. 4, inverter 113 would be unnecessary and the output on line 29 of the circuit of FIG. 13 would be connected directly to the input on line 29 of the circuit of FIG. 4.

Referring to FIG. 4, OR gate 107 combines the outputs of AND gates 100-103 to produce a HIGH signal on output $1_2$ when that output takes the value "1". In a like manner, OR gate 108 combines the output of AND gates 101 and 105 with the input signal indicative of the state $T_3 = 2$ to produce a HIGH signal when binary bit value $2_2$ takes the value "1". Finally, OR gate 109 combines the outputs of AND gates 102 and 106 with the input signal $T_3 = 2$ to produce a HIGH signal when the bit value $4_2$ takes the value "1".

The specific configuration of AND gates and OR gates shown in FIG. 4 is arrived at by an application of the Karnaugh-map method known in the art. To express the above relationships in the terms of mathematical equations:

$$(1_2) = GE + HD + HF + IE$$

$$(2_2) = I + HD + GF$$

$$(4_2) = I + HE + HF$$

where: D, E, F, G, H, and I are the binary values corresponding to the control signals $T_1 = 0$, $T_1 = 1$, $T_1 = 2$, $T_3 = 0$, $T_3 = 1$, and $T_3 = 2$, respectively.

It should be noted that the particular hardware embodiment shown in FIG. 4 is for illustrative purposes only and should not be construed to delimit the invention in any manner. It will be understood, by one skilled in the art, that any hardware implementation of the above equations for $1_2$, $2_2$, and $4_2$ would accomplish the objects of the invention. It should also be noted that the detailed circuit schematic for FIG. 4 can be realized in any circuit technology (e.g., MOSFET, bipolar, etc.).

While the invention has been described in its preferred embodiments, it is to be understood that the words which have been used are words of description and enablement rather than limitation and that changes may be made to the description without departing from the true scope and spirit of the invention.

I claim:

1. A communications interface including a first converter for performing a binary to binary conversion having a first binary control signal generator and a trinary driver and also a second converter for performing a trinary to binary conversion having a trinary receiver and a second binary control signal generator and said communications interface also having a transmission channel for transmitting trinary logic levels where said first converter performs at least one of the functions:

$$(T_1 = 1) = \overline{AB}C + ABC + A\overline{BC}$$

$$(T_1 = 2) = \overline{AB}\overline{C} + A\overline{B}C$$

$$(T_1 = 0) = \overline{ABC} + \overline{A}BC + AB\overline{C}$$

$$(T_3 = 1) = A\overline{B} + \overline{A}BC$$

$$(T_3 = 2) = AB$$

$$(T_3=0) = \overline{AB} + \overline{AC}$$

where outputs $T_1=1$, $T_1=2$, $T_1=0$, $T_3=1$, $T_3=2$, $T_3=0$ are are a first set of binary control signals generated by said first binary control signal generator and where A, B and C are the bit values of any three bits in adjacent bit positions selected from a first set of binary logic signals to be converted from binary to trinary.

2. A communication interface as recited in claim 1 wherein said first converter means produces at least one of the outputs $T_1 \neq 1$, $T_1 \neq 2$, $T_1 \neq 0$, $T_3 \neq 1$, $T_3 \neq 2$, and $T_3 \neq 0$ which are complements of the outputs $T_1=1$, $T_1=2$, $T_1=0$, $T_3=1$, $T_3=2$, and $T_3=0$, respectively.

3. A communications interface as recited in claim 2 wherein said trinary driver means comprises:
   a first bipolar transistor circuit connected between a first node and said transmission channel and switchable between a high impedance and a low impedance state under control of said binary control signal $T_1 \neq 1$, whereby said first node is connected to said transmission channel by said first circuit when said control signal $T_1 \neq 1$ is not present;
   a second bipolar transistor circuit connected between a second node and said transmission channel and switchable between a high impedance and a low impedance state under control of said binary control signal $T_1 \neq 2$, whereby said second node is connected to said transmission channel by said second circuit when said control signal $T_1=2$ is not present; and
   a third bipolar transistor circuit connected between a third node and said transmission channel and switchable between a high impedance and a low impedance state under control of said binary control signal $T_1=0$, whereby said third node is connected to said transmission channel by said third circuit when said control signal $T_1=0$ is present;
   wherein said first node is connected to a first voltage source, the second node is connected to a second voltage source, and the third node is connected to a third voltage source 4. A communications interface as recited in claim 3 wherein said third voltage source is substantially equal to ground potential.

5. A communications interface as recited in claim 1 wherein said trinary driver means comprises:
   a first semiconductor switch circuit, connected between a first node and said transmission channel, operative to connect said first node to said transmission channel when said binary control signal $T_1=1$ is present;
   a second semiconductor switch circuit, connected between a second node and said transmission channel, operative to connect said second node to said transmission channel when said binary control signal $T_1=2$ is present; and
   a third semiconductor switch circuit, connected between a third node and said transmission channel, operative to connect said transmission channel to said third node when said binary control signal $T_1=0$ is present
   wherein said first node is connected to a first voltage source, the second node is connected to a second voltage source, and the third node is connected to a third voltage source.

6. A communications interface as recited in claim 5 wherein said third voltage source is substantially equal to ground potential.

7. A communications interface as recited in claim 5 wherein said first, second, and third semiconductor switch circuits each comprise a MOSFET transistor.

8. A communications interface as recited in claim 5 wherein said trinary driver means further comprises:
   a fourth semiconductor switch circuit, connected between each of said first, second, and third semiconductor switch circuits and said transmission channel, controllable by a binary enable signal, whereby said transmission channel is disconnected from first, second, and third semiconductor switch circuits when said binary enable signal is not present.

9. A communications interface as recited in claim 8 wherein said fourth semiconductor switch circuit comprises two MOSFET transistors.

10. A communications interface as recited in claim 1 wherein said trinary receiver means comprises:
    a first voltage level, a second voltage level and a third voltage level wherein said first voltage level is greater than said second voltage level and said second voltage level is greater than said third voltage level;
    a first voltage comparator means for producing a first binary control signal when the voltage on said transmission channel is greater than or equal to said first voltage level;
    a second voltage comparator means for producing a second binary control signal when the voltage on said transmission channel is less than or equal to said third voltage level; and
    logic circuit means for combining said first and said second binary controls signals to produce a third binary control signal when the voltage on said transmission channel is equal to said second voltage level which is less than said first voltage and greater than said third voltage.

11. A communications interface as recited in claim 1 wherein said trinary receiver means includes:
    a first voltage level, a second voltage level and a third voltage level wherein said first voltage level is greater than said second voltage level and said second voltage level is greater than said third voltage level;
    first MOSFET circuit means, connectable to said transmission channel, for producing a first binary control signal on a first output line when the voltage on said transmission channel is greater than or equal to said first voltage level;
    second MOSFET circuit means connectable to said transmission channel, for producing a second control signal on a second output line when the voltage on said transmission channel is less than or equal to said third voltage level; and
    third MOSFET circuit means, connectable to said transmission channel, for producing a third binary control signal on a third output line when the voltage on said transmission channel is equal to said second voltage level.

12. A communications interface as recited in claim 11 wherein said first MOSFET circuit means includes:
    a first pair of CMOS transistors having their gates connected to said transmission channel, and having gate threshold volgates whereby the pair switches its binary output when a voltage greater than or equal to said first voltage level is applied to their connected gates; and inverter means comprising a second pair of CMOS transistors having their gates connected to said binary output of said first pair of CMOS transistors and its output connected to said first output line, for inverting said binary output of said first pair of CMOS transistors to produce said first binary control signal on said first output line.

13. A communication interface as recited in claim 12 wherein said second MOSFET circuit means includes:
a third pair of CMOS transistors, having their gate connected to said transmission channel, and having gate threshold voltages whereby the pair switches its binary output when a voltage less than or equal to said third voltage level is applied to their connected gates.

14. A communication interface as recited in claim 13 wherein said third MOSFET circuit means includes:
first, second, third, and fourth CMOS transistors configured as a logical NOR circuit having said first and said second output lines as inputs and having said third output line as an output;
whereby said NOR circuit produces said third binary control signal on said third output line during the simultaneous absence of said first binary control signal and said second binary control signal.

15. A communications interface as recited in claim 11 wherein said first MOSFET circuit means includes:
a P-channel depletion mode transistor connected intermediate said first output line and ground potential and having a gate connected to said first output line; and
a P-channel enhancement mode transistor connected intermediate said first output line and a first voltage source and having a gate connectable to said transmission channel.

16. A communications interface as recited in claim 15 wherein said second MOSFET circuit means includes:
a N-channel enhancement mode transistor connected intermediate said second output line and ground potential, and having a gate connected to said transmission channel; and
a N-channel depletion mode transistor connected intermediate said first voltage source and said second output line, and having a gate connected to said second output line.

17. A communications interface as recited in claim 16 wherein said third MOSFET circuit means includes: a first N-channel enhancement mode transistor connected intermediate said third output line and ground potential, and having a gate connected to said first output line;
a second N-channel enhancement mode transistor connected intermediate said third output line and ground potential, and having a gate connected to said second output line; and
a N-channel depletion mode transistor connected intermediate said third output line and said first voltage source, and having a gate connected to said third output line.

18. A communications interface as recited in claim 11 wherein said first MOSFET circuit means includes:
a first N-channel enhancement mode transistor connected intermediate said first output line and ground potential, and having a gate;
a first N-channel depletion mode transistor connected intermediate said first output line and a first voltage source, and having a gate connected to said first output line;
a second N-channel enhancement mode transistor connected intermediate the gate of said first enhancement mode transistor and ground potential, and having a gate connected to said transmission channel; and
a second N-channel depletion mode transistor connected intermediate said first voltage source and the gate of said first enhancement mode transistor, and having a gate connected to the gate of said first enhancement mode transistor.

19. A communications interface as recited in claim 11 wherein said second MOSFET circuit means comprises:
a N-channel enhancement mode transistor connected intermediate said second output line and ground potential, and having a gate connected to said transmission channel; and
a N-channel depletion mode transistor connected intermediate a first voltage source and said second output line, and having a gate connected to said second output line.

20. A communications interface as recited in claim 11 wherein said third MOSFET circuit means comprises:
a first N-channel enhancement mode transistor connected intermediate said third output line and ground potential, and having a gate connected to said first output line;
a second N-channel enhancement mode transistor connected intermediate said third output line and ground potential, and having a gate connected to said second output line; and
a N-channel depletion mode transistor connected intermediate said third output line and a first voltage source, and having a gate connected to said third output line.

21. A communications interface as recited in claim 1 wherein said trinary receiver means includes:
a first MOSFET circuit, connected to said transmission channel, for producing a first binary control signal on a first output line when the voltage on said transmission channel is less than a first voltage;
a second MOSFET circuit, connected to said transmission channel, for producing a second binary control signal on a second output line when the voltage on said transmission channel is less than a second voltage; and
a third MOSFET circuit, connected to said transmission channel, for producing a third binary control signal when the voltage on said transmission channel is less than said first voltage and greater than said second voltage.

22. A communications interface as recited in claim 1 wherein said trinary to binary translator means performs the functions:

$$(A) = GE + HD + HF + IE$$

$$(B) = I = HD = GF$$

$$(C) = I + HE + HF$$

where outputs A, B, and C are the bit values of three bits in adjacent bit positions in said second set of binary logic signals; and
where D, E, F, G, H, and I are said first set of binary control signals $T_1=0$, $T_1=1$, $T_1=2$, $T_3=0$, $T_3=1$, and $T_3=2$, respectively for gating said trinary driver means.

23. A communications interface for transmission of trinary logic data over a transmission channel between a trinary driver and a trinary receiver wherein the trinary receiver means includes:
- a first MOSFET circuit, connected to said transmission channel, for producing a first binary control signal on a first output line when the voltage on said transmission channel is less than a first voltage;
- a second MOSFET circuit, connected to said transmission channel, for producing a second binary control signal on a second output line when the voltage on said transmission channel is less than a second voltage; and
- a third MOSFET circuit, connected to said transmission channel, for producing a third binary control signal on a third output line when the voltage on said transmission channel is greater than said first voltage and less than said second voltage;

wherein, said second voltage is less than said first voltage.

24. A communication interface for transmission of trinary logic data over a transmission channel between a trinary driver and a trinary receiver wherein said transmission channel includes trinary power amplifier means for increasing the trinary signal transmission distance, said power amplifier means having an input connected to said trinary driver means and an output connected to said trinary receiver means, said power amplifier means comprising:
- a first bipolar transistor circuit, controlled by the input to said amplifier, for connecting the output of said amplifier to a first voltage source when the voltage on said input is greater than a first voltage level;
- a second bipolar transistor circuit, controlled by the input of said amplifier, for connecting the output of said amplifier to ground potential when the voltage on said input is less than a second voltage level; and
- a third bipolar transistor circuit, controlled by the input of said amplifier, for connecting the output of said amplifier to a second voltage source when the voltage on said input in less than said first voltage level and greater than said second voltage level;

wherein said first voltage level is greater than said second voltage level, and wherein said first voltage source is of a greater potential than said second voltage source.

* * * * *